(12) United States Patent
Langhammer

(10) Patent No.: US 8,977,938 B2
(45) Date of Patent: Mar. 10, 2015

(54) PARALLEL DECOMPOSITION OF REED SOLOMON UMBRELLA CODES

(71) Applicant: Altera Corporation, San Jose, CA (US)

(72) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 148 days.

(21) Appl. No.: 13/762,739

(22) Filed: Feb. 8, 2013

(65) Prior Publication Data

US 2014/0229791 A1 Aug. 14, 2014

(51) Int. Cl.
*H03M 13/00* (2006.01)
*H03M 13/15* (2006.01)

(52) U.S. Cl.
CPC ...... *H03M 13/1515* (2013.01); *H03M 13/1595* (2013.01); *H03M 13/155* (2013.01); *H03M 13/153* (2013.01); *H03M 13/1545* (2013.01); *H03M 13/1585* (2013.01); *H03M 13/6502* (2013.01); *H03M 13/6561* (2013.01)
USPC .......................................... 714/784; 714/781

(58) Field of Classification Search
CPC .......... H03M 13/1515; H03M 13/155; H03M 13/1595
USPC .................................................. 714/784, 781
See application file for complete search history.

(56) References Cited

U.S. PATENT DOCUMENTS

| | | | |
|---|---|---|---|
| 6,625,775 B1 * | 9/2003 | Kim | 714/755 |
| 6,633,856 B2 * | 10/2003 | Richardson et al. | 706/15 |
| 7,802,164 B2 * | 9/2010 | Hong et al. | 714/752 |
| 7,930,611 B2 * | 4/2011 | Huang et al. | 714/752 |
| 2014/0122976 A1 * | 5/2014 | Wang et al. | 714/776 |

* cited by examiner

*Primary Examiner* — Joseph D Torres
(74) *Attorney, Agent, or Firm* — Ropes & Gray LLP

(57) ABSTRACT

Systems, methods, apparatus, and techniques are presented for processing a codeword. A Reed-Solomon mother codeword n symbols in length and having k check symbols is received, and the n symbols of the received Reed-Solomon mother codeword are separated into v Reed-Solomon daughter codewords, where v is a decomposition factor associated with the Reed-Solomon mother codeword. The v Reed-Solomon daughter codewords are processed in a respective set of v parallel processes to output v decoded codewords.

15 Claims, 9 Drawing Sheets

US 8,977,938 B2

PARALLEL DECOMPOSITION OF REED SOLOMON UMBRELLA CODES

BACKGROUND OF THE INVENTION

Many modern applications encode data prior to transmission of the data on a network using cyclic error correcting codes such as Reed-Solomon codes. Such codes are capable of providing powerful error correction capability. For example, a Reed-Solomon code of length n and including n−k check symbols may detect any combination of up to t=n−k erroneous symbols and correct any combination of up to $\lfloor t/2 \rfloor$ symbols, where $\lfloor . \rfloor$ denotes the floor function.

Reed-Solomon codes are increasingly used in high speed data applications. For example, IEEE802.3 standards for backplanes prescribe the use of Reed-Solomon codes. However, decoding Reed-Solomon codes quickly enough to satisfy the throughput requirements of such high-speed data applications may be challenging. In one approach, multiple Forward Error Correction (FEC) circuits are instantiated as part of a decoder in order to achieve a desired data throughput. While multiple FEC circuits may be implemented at a relatively low cost compared to overall device cost (overall device cost may include a cost for a die of the required size, digital logic and transceivers, and packaging), other considerations may make such a design undesirable. For example, instantiating as many FECs as required in the maximum case may result in the inclusion of too many application specific components in a Field Programmable Gate Array (FPGA).

For many applications where FEC codes, such as Reed-Solomon codes are used, they are designed for "typical" channels. In cases where the channel is known to have a lower error rate than the code is designed for, a partial decoding of the codeword can be performed. For Reed-Solomon codes, this may take the form of the full codeword being encoded and decoding only a subset of error polynomials. Alternatively, the codeword may be only partially encoded.

SUMMARY OF THE INVENTION

Systems, methods, apparatus, and techniques are presented for processing a codeword. In some arrangements, a Reed-Solomon mother codeword n symbols in length and having k check symbols is received, the n symbols of the received Reed-Solomon mother codeword are separated into v Reed-Solomon daughter codewords, where v is a decomposition factor associated with the Reed-Solomon mother codeword. The v Reed-Solomon daughter codewords are processed in a respective set of v parallel processes to output v decoded codewords.

In some arrangements, codeword processing circuitry includes receiver circuitry configured to receive a Reed-Solomon mother codeword n symbols in length and having k check symbols, parallelization circuitry configured to separate the n symbols of the received Reed-Solomon mother codeword into v Reed-Solomon daughter codewords, where v is a decomposition factor associated with the received Reed-Solomon mother codeword, and decoding circuitry configured to process the v Reed-Solomon daughter codewords in a respective set of v parallel processes to output v decoded codewords.

In some arrangements, error locator polynomial circuitry includes a register bank arranged in a circular shift structure, where the register bank is configured to store a syndrome value of a Reed-Solomon mother code and is decomposable into a plurality of register sub-banks, each register sub-bank arranged in a circular shift structure and configured to store a syndrome value of a Reed-Solomon daughter code associated with the Reed-Solomon mother code.

In some arrangements, Chien search circuitry includes a Galois field based multiply and sum structure and a decomposed multiply and sum structure. In some implementations of the Chien search circuitry, the Galois field based multiply and sum structure includes a plurality of Galois field variable multipliers, where the plurality of Galois field variable multipliers are configured to multiply each of a set of polynomial values with a respective element from a set of elements and add results of each multiplication to produce a root of a polynomial. Further, the decomposed multiply and sum structure includes circuitry identical to a portion of the Galois field based multiply and sum structure, the decomposed multiply and sum structure configured to apply a subset of the set of elements to the circuitry identical to a portion of the Galois field based multiply and sum structure.

In some other implementations of the Chien search circuitry, the Chien search circuitry includes a Galois field based multiply and sum structure comprising a plurality of Galois field fixed multipliers configured to select a subset of the plurality of Galois field fixed multipliers, progressively multiply each of a set of polynomial values with a respective element from a set of elements using one of the subset of the plurality of Galois field fixed multipliers, and add results of each multiplication to produce a root of a polynomial. Further, the decomposed multiply and sum structure includes circuitry identical to a portion of the Galois field based multiply and sum structure and is configured to apply a subset of the set of elements to the circuitry identical to a portion of the Galois field based multiply and sum structure.

BRIEF DESCRIPTION OF THE DRAWINGS

The above and other advantages of the invention will be apparent upon consideration of the following detailed description, taken in conjunction with the accompanying drawings, in which like referenced characters refer to like parts throughout, and in which.

DETAILED DESCRIPTION OF THE INVENTION

Disclosed herein are methods, systems, and apparatus for implementing Reed-Solomon decoders, and other types of decoders, in a network environment. The disclosed methods, systems, and apparatus advantageously use umbrella codes to reduce a latency associated with the decoding of a Reed-Solomon codeword.

In many cases, it is advantageous to tradeoff coding gain for a reduced latency. Such a tradeoff may be achieved in a single architecture on the basis of Reed-Solomon umbrella codes. Specifically, Reed-Solomon umbrella codes are defined as an integer number of subsets of a larger Reed Solomon (RS) code. For example, the decomposition of a (n, k) Reed-Solomon code into two (n/2, k/2) Reed-Solomon codes or a four (n/4, k/4) Reed-Solomon codes. In this disclosure, the (n, k) Reed-Solomon code will be referred to as a "mother code" and a decomposed Reed-Solomon code based on the (n, k) Reed-Solomon code (e.g., a (n/2, k/2) Reed-Solomon code or (n/4, k/4) Reed-Solomon code) will be referred to as a "daughter code." As a first illustrative example, a (440, 424) Reed-Solomon mother code may be decomposed into two (220, 212) Reed-Solomon daughter codes or four (110, 106) Reed-Solomon daughter codes. As another example, a (528, 516) Reed-Solomon mother code may be decomposed into two (264, 258) Reed-Solomon daughter codes or four (132, 129) Reed-Solomon daughter codes. In the case of four (132, 129) Reed-Solomon daughter codes, each code includes three check symbols and is therefore capable of correcting one symbol error, which is the same number of errors that could be corrected if only two check symbols were used. This use of an odd number of check symbols by the (132, 129) code, however, is useful because the increased distance between codewords can be used to detect errors more accurately than if the number of check symbols was only two (i.e., an even number).

One possibility to improve the efficiency of FEC umbrella code implementations is to decompose a Reed Solomon decoder into multiple parallel cores based on an umbrella decomposition of a Reed-Solomon code. In particular, latency through a Reed-Solomon decoding architecture is typically proportional to 2n, so if n is reduced, so is latency. The total power of consumption will be approximately the same whether multiple parallel cores or a serial decomposition architecture is used, but latency will be reduced in the case of multiple parallel cores as compared to the serial decomposition case. Further, in the case of multiple parallel cores, the same interface and gearbox may be used for both the mother code and any daughter code.

Figure 1:
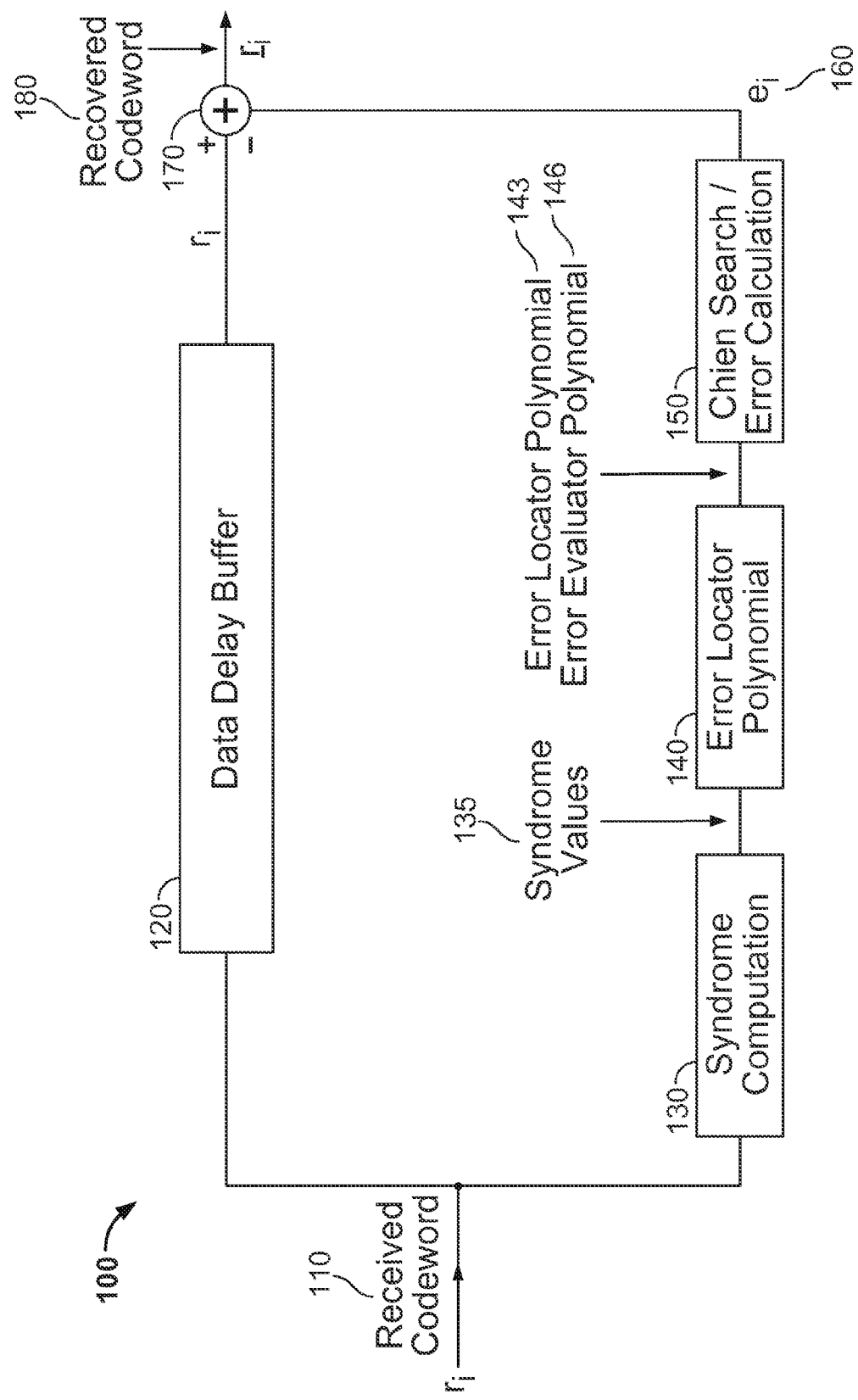
FIG. 1 illustrates a Reed-Solomon decoding architecture in accordance with an arrangement.

FIG. 1 illustrates a Reed-Solomon decoding architecture in accordance with an arrangement. A decoder 100 is used to sequentially process received codewords to recover corresponding datawords. The decoder 100 receives the codewords through receiver circuitry (not illustrated in FIG. 1) over a wired, wireless, or hybrid network. In an arrangement, codewords are received over a 100G backplane.

The decoder 100 receives a codeword 110, which has n symbols of which k symbols correspond to data symbols and n–k symbols correspond to check symbols. Accordingly, the received codeword 110 will also be denoted by its symbols $r_1, \ldots, r_n$ or generically by the symbol $r_i$. In an arrangement, the received codeword 110 is generated by a (440, 424) Reed-Solomon code (i.e., k=424 and n=440) with each symbol conveying m=9 bits of information. As is conventional, the number of possible values for a given code symbol will be denoted by $q^m$ where q and m are each integers (stated in other terms, code symbols are selected from $GF(q^m)$, where GF(u) denotes the Galois field of order u). Here, q=2 and m=9. In other arrangements of the present invention, other values of k, n, and/or $q^m$ are used.

The received codeword 110 is provided to a data delay buffer 120 and a syndrome computation module 130. As used herein, the term "module" refers to any suitable circuitry used to implement the functionality described in relationship to the module. In one arrangement, the functionality of a given module is implemented primarily (or fully) in FPGA-based logic. The data delay buffer 120 delays (e.g., stores in registers) output of the received codeword 110 for a length of time (i.e., a number of clock cycles) sufficient for all or a portion of the received codeword 110 to be processed by the syndrome computation module 130, an error locator polynomial module 140, and a Chien search and error calculation module 150. As will be described below, each of the syndrome computation module 130, the error locator polynomial module 140, and the Chien search and error calculation module 150 employ a parallelized architecture based on Reed-Solomon umbrella codes.

The syndrome computation module 130 processes the received codeword 110 to obtain 2t syndrome values 135 corresponding to the received codeword 110. The syndrome values 135 will be denoted $S_1, \ldots, S_{2t}$. For example, in the case of a (255, 251) decoder, which is characterized by the value t=2, the syndrome values are denoted $S_1, S_2, S_3$, and $S_4$. The syndrome values are computed according to the equation $$S_j(x) = \sum_{i=0}^{n-1} r_i x^{ij},$$

where j=1, 2, ..., 2t and where the $x^{ij}$ are elements from the Galois field of order m.

Although multipliers used for the syndrome calculations could be variable multipliers (where both inputs can be changed), so that parallel decomposition could be achieved by just changing the coefficients, this may not be very efficient. A constant finite field multiplier (where one of the inputs is variable, the other fixed) is usually much smaller and faster (shorter combinatorial depth). What is described next is a technique for the parallel decomposition of the calculation of the syndrome values.

As the syndrome calculation is usually the smallest part of the decoder, it is usually more efficient to replicate a subset of the syndrome calculation for each daughter code. The syndrome calculation for the mother code can be used to calculate syndromes for any of the daughter codes by zeroing the inputs to the higher order syndrome calculations (higher values of j). The additional syndrome calculation structures required would then be $S_j \in \{0, t\}$, $S_j \in \{0, t/2\}$, $S_j \in \{0, t/4\}$, and so on, giving a total syndrome calculation area of up to twice that of the mother code alone. As the syndrome calculation is the smallest part of the decoder, doubling the area of this portion of the design will have a minimal impact on the overall area.

The error locator polynomial module 140 processes the syndrome values 135 to produce an error locator polynomial 143 and an error evaluator polynomial 146. The error locator polynomial 143 and the error evaluator polynomial 146 will also be denoted herein by $\Lambda(x)$ and $\Omega(x)$, respectively. As would be understood by one of ordinary skill, based on the disclosure and teachings herein, the error locator polynomial 143 and the error evaluation polynomial 146 may be derived from the syndrome values 135 using a suitable technique. For example, in respective arrangements, the error locator polynomial module 140 includes functionality implementing one of the Euclidean algorithm, Peterson-Gorenstein-Zierler algorithm, Berlekamp-Massey algorithm, and Galois-field Fourier transform method.

Regardless of the techniques used to derive the error locator polynomial 143 and the error evaluator polynomial 146, each of these quantities may be represented by a polynomial in a Galois field of order m. Specifically, the error evaluator polynomial 146 is represented by the polynomial $$\Omega(x) = (\Omega_1 + \Omega_2 x + \Omega_3 x^2 \ldots), \qquad (1)$$

where each of the coefficients $\Omega_i$ are from the Galois field of order m. Similarly, the error locator polynomial 143 is represented by the polynomial $$\Lambda(x) = \Lambda_0 + \Lambda_1 x + \Lambda_2 x^2 + \Lambda_3 x^3 + \Lambda_4 x^4 + \Lambda_5 x^5 + \qquad (2)$$

where the coefficients $\Lambda_i$ are from the Galois field of order m. As would be understood by one of ordinary skill, based on the disclosure and teachings herein, the error locator polynomial 143 is used to perform a Chien search, while a derivative of the error locator polynomial 143 is used to evaluate error values. The error locator polynomial 143 is provided to the Chien search and error calculation module 150 to produce error values 160. The errors values 160 will also be denoted by $e_1, \ldots e_n$, where $e_i$ denotes the value of the error in the $i^{th}$ position of the received codeword 110.

To determine the error values 160, the Chien search and error calculation module 150 implements both a Chien search module, to identify symbol locations containing errors in the received codeword 110, and an error value calculation module, to determine the error values at the identified symbol locations. As would be understood by one of ordinary skill, based on the disclosure and teachings herein, the Chien search module determines the roots, if any, of the error locator polynomial 143. In particular, the Chien search module is implemented by evaluating the error locator polynomial at each value of the appropriate Galois field corresponding to a respective location in the received codeword 110 to determine if the error locator polynomial has a value equal to 0 at that location. If so, the received codeword 110 is identified as having an error at that location. If not, the received codeword 110 is identified as being error-free at that location.

Equivalently, instead of comparing evaluated values of the error locator polynomial to the value 0, the Chien search module may compare, in an algebraically identical or equivalent way, a value of the error locator polynomial minus the value 1 to the value 1 for convenience of implementation. Similarly, the Chien search module may perform any other algebraically equivalent comparison to that described herein.

The Chien search and error calculation module 150 determines an error value $e_i$ for each location of the received codeword 110 identified by the Chien search module as containing a symbol error. In particular, the Chien search module evaluates error values using a technique based on the Forney algorithm. Using the Forney algorithm, the Chien search module determines the error values $e_i$ according to the following relationship $$e_i = \frac{\Omega(x^{-i})}{\Lambda'(x^{-i})} \qquad (3)$$

One of ordinary skill would understand, based on the disclosure and teaching herein, that the Chien search module may also determine the error values $e_i$ using an allegorically equivalent relationship.

Figure 2:
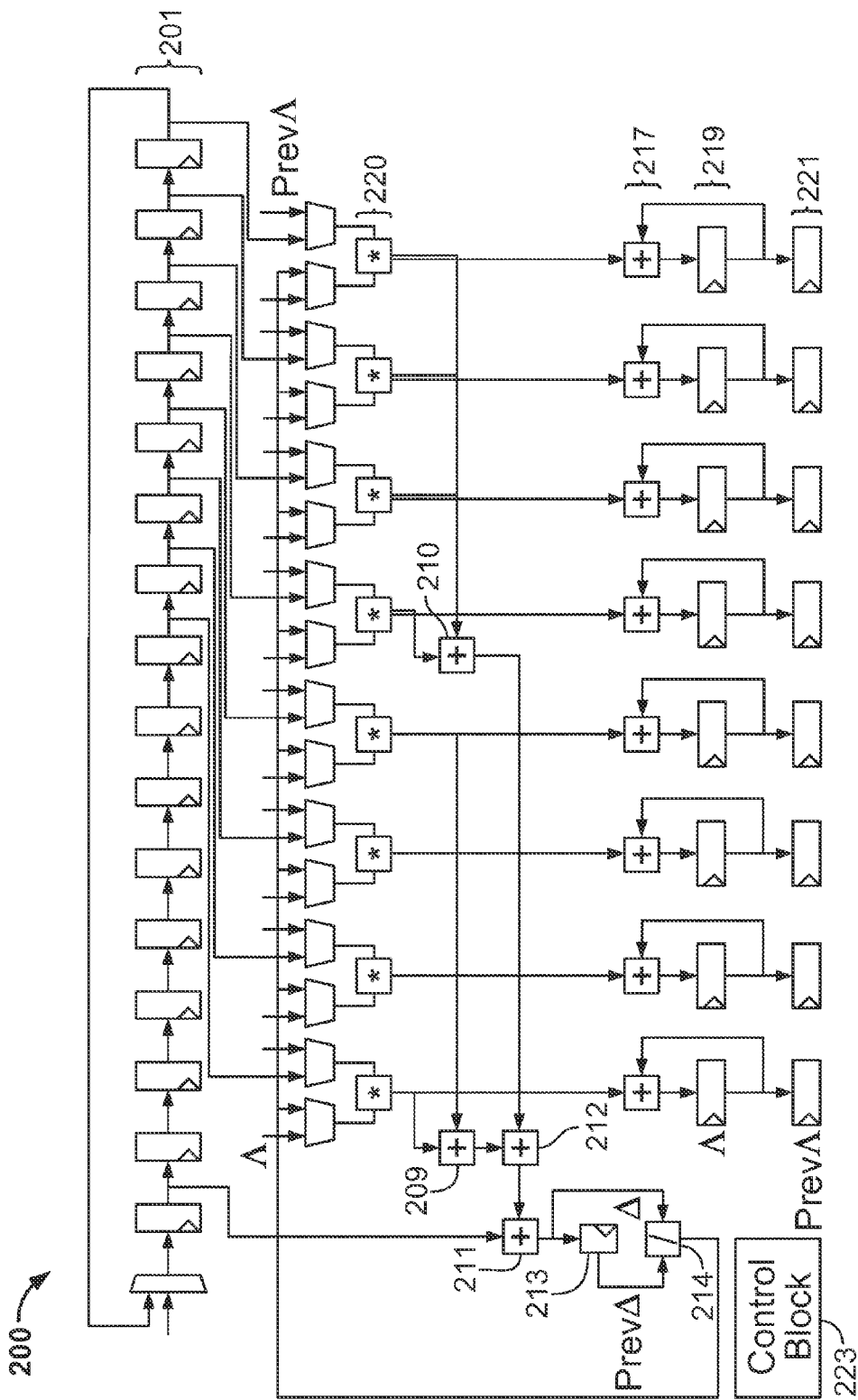
FIG. 2 illustrates an architecture for determining an error locator polynomial from syndrome values of a received codeword in accordance with an arrangement.

FIG. 2 illustrates an architecture for determining an error locator polynomial from syndrome values of a received codeword in accordance with an arrangement. In an arrangement, architecture 200 is included in the error locator polynomial module 140. FIG. 2 illustrates a case where the error locator polynomial module 140 computes an error locator polynomial based on the Berlekamp-Massey algorithm and where the number of check symbols, n-k, is 16. Accordingly, there are 16 syndrome values $S_1, \ldots, S_{16}$, which are stored in the 16 corresponding registers of the register bank 201. Because there are 16 syndrome values, 16 iterations are required for the architecture 200 to produce an error locator polynomial (i.e., there are as many iterations as there are syndromes). In particular, the syndrome values stored in the register bank 201 are circularly shifted with each iteration. The error locator polynomial is a polynomial that connects all of the syndromes together, i.e., any syndrome value can be found by multiplying the previous syndrome polynomials with the error locator polynomial.

The first step of each iteration of the architecture 200 is to find a delta value, or a difference between a syndrome and the current state of the error locator polynomial and the previous syndromes. This is done by taking the dot product of a number of the syndromes stored in the register bank 201 with the current state of the error locator polynomial, which is stored in the register bank 219, multiplying these two quantities together using the Galois-Field multipliers of multiplier bank 220, summing the individual results using Galois-Field adders 209, 210, and 212, and adding the first syndrome using the Galois-Field adder 211. The calculated delta value is stored in register 213 at the end of an corresponding iteration.

If the delta value is non-zero, then the error locator polynomial is updated. This is done by multiplying the previous error locator polynomial, stored in the register bank 221, term by term, by a value consisting of the delta value divided by the previous delta value (this latter value is computed by the divider 214). The individual multiplier outputs of multiplier bank 220 are then added to the respective error locator polynomial terms using the adder bank 217, and those results are stored in the register bank 219. The delta value is then stored in register 213, and the error locator polynomial (before the multiplier results are added) is stored in the register bank 221. The control block 223 is used to control the timing and signal voltage levels used to implement the functionality described above.

Because the number of iterations performed by the architecture 200 is the same as the number of syndromes, one way to produce a parallel decomposition of the architecture 200 would be to store the multiple syndrome sets (each an integer fraction of the mother code syndrome number), and operate on each in turn. This would still perform all error locator polynomial calculations in the total time equivalent to the mother code calculation time. However, the worst case daughter code latency would be the same as the mother code latency (at least through this portion of the processing pipeline) rather than an integer fraction of the time. An alternate method is to split the Berlekamp-Massey architecture into an integer number of parallel cores as explained next.

Figure 3:
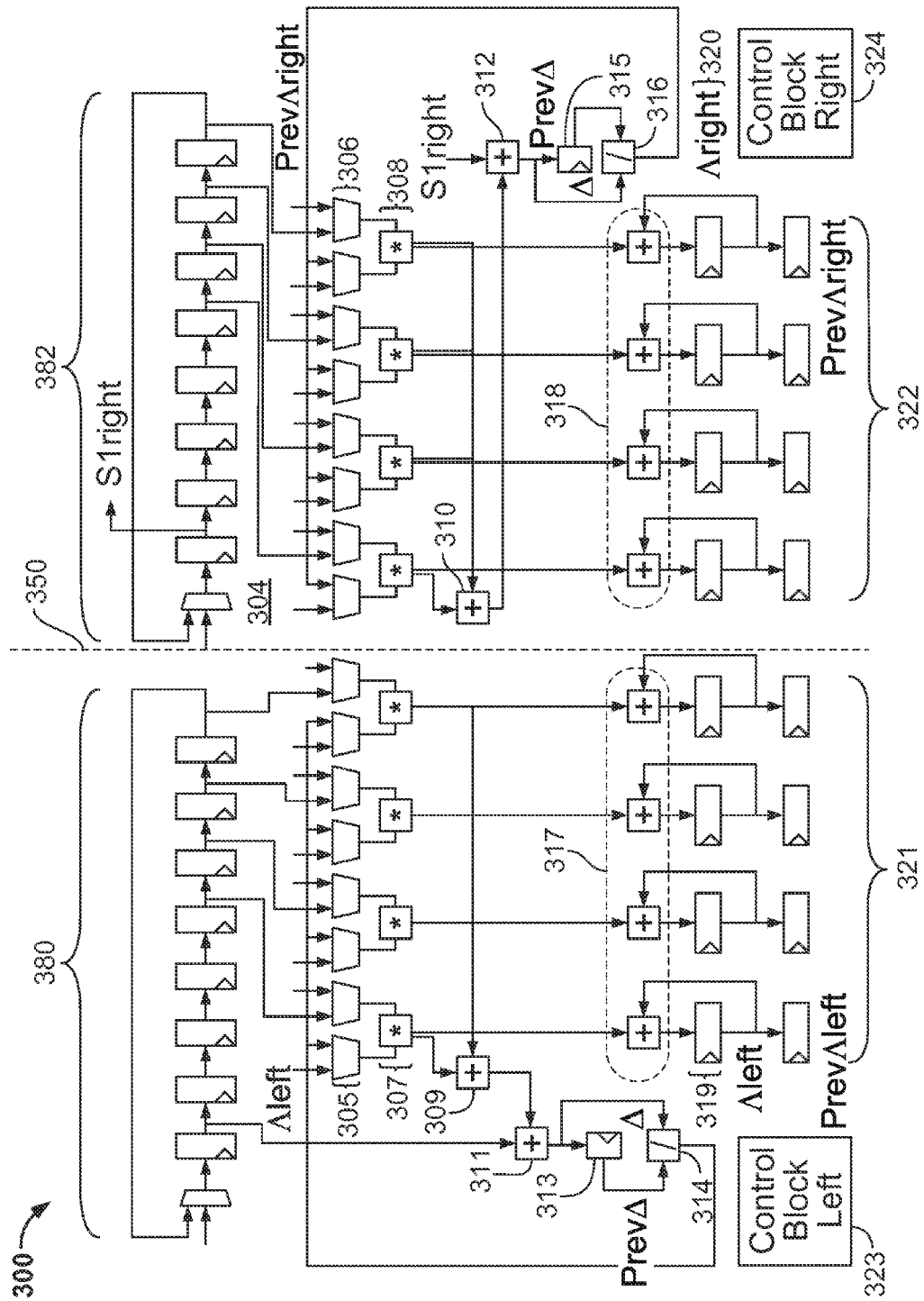
FIG. 3 illustrates a multi-core architecture for determining an error locator polynomial from syndrome values of a received codeword based on an umbrella decomposition of a Reed-Solomon code in accordance with an arrangement.

FIG. 3 illustrates a multi-core architecture for determining an error locator polynomial from syndrome values of a received codeword based on an umbrella decomposition of a Reed-Solomon code in accordance with an arrangement. While the architecture 300 illustrates the case of two parallel cores, the same principles and techniques can be used to design an architecture with any integer number of parallel cores that is equal to a decomposition factor between a mother code and a corresponding daughter code. For example, in the case where an FPGA utilizes a (n, k) mother code and a (n/4, k/4) daughter code, the architecture 300 may be adapted to include four parallel cores based on the techniques described herein.

As depicted in FIG. 3, the two cores of the architecture 300 are split along dashed line 350. While the introduction of a second core requires an additional (i.e., second) control block, control block 324 (or alternatively, control block 323), the associated logic is relatively small in size compared to most of the other logic elements present in the architecture 300. As compared to the register bank 201 of architecture 200, architecture 300 includes two separated register banks, i.e., register banks 380 and 382, and includes an additional multiplexer, i.e., multiplexer 304. The inclusion of the multiplexer 304 represents a trivial amount of additional logic (further, in an FPGA, the logic associated with a register can perform the function of the multiplexer 304 so that no additional logic is required). Similarly, whereas the architecture 200 includes adder bank 217, register bank 219, and register bank 221, the architecture 300 includes separated versions of these components, i.e., adder banks 317 and 318, register banks 319 and 320, and register banks 321 and 322.

Continuing the comparison with the architecture 300, the Galois field adder tree required for the delta value calculation is decomposed. Specifically, adders 309 and 310 of FIG. 3 (which have counterpart adders 209 and 210 in FIG. 2) do not feed a counterpart to adder 212 of FIG. 2, but rather, are the final stage in their respective adder trees. This change relative to the architecture 200 will utilize at most one additional multiplexer per core decomposition. Further, each additional core decomposition utilizes an additional Galois field divider (i.e., the architecture 300 includes dividers 314 and 316, whereas the architecture 200 included only a single such divider, i.e., the divider 214) as well as the associated circuitry, i.e., adders 311 and 312 and registers 313 and 315 in FIG. 3.

Figure 4:
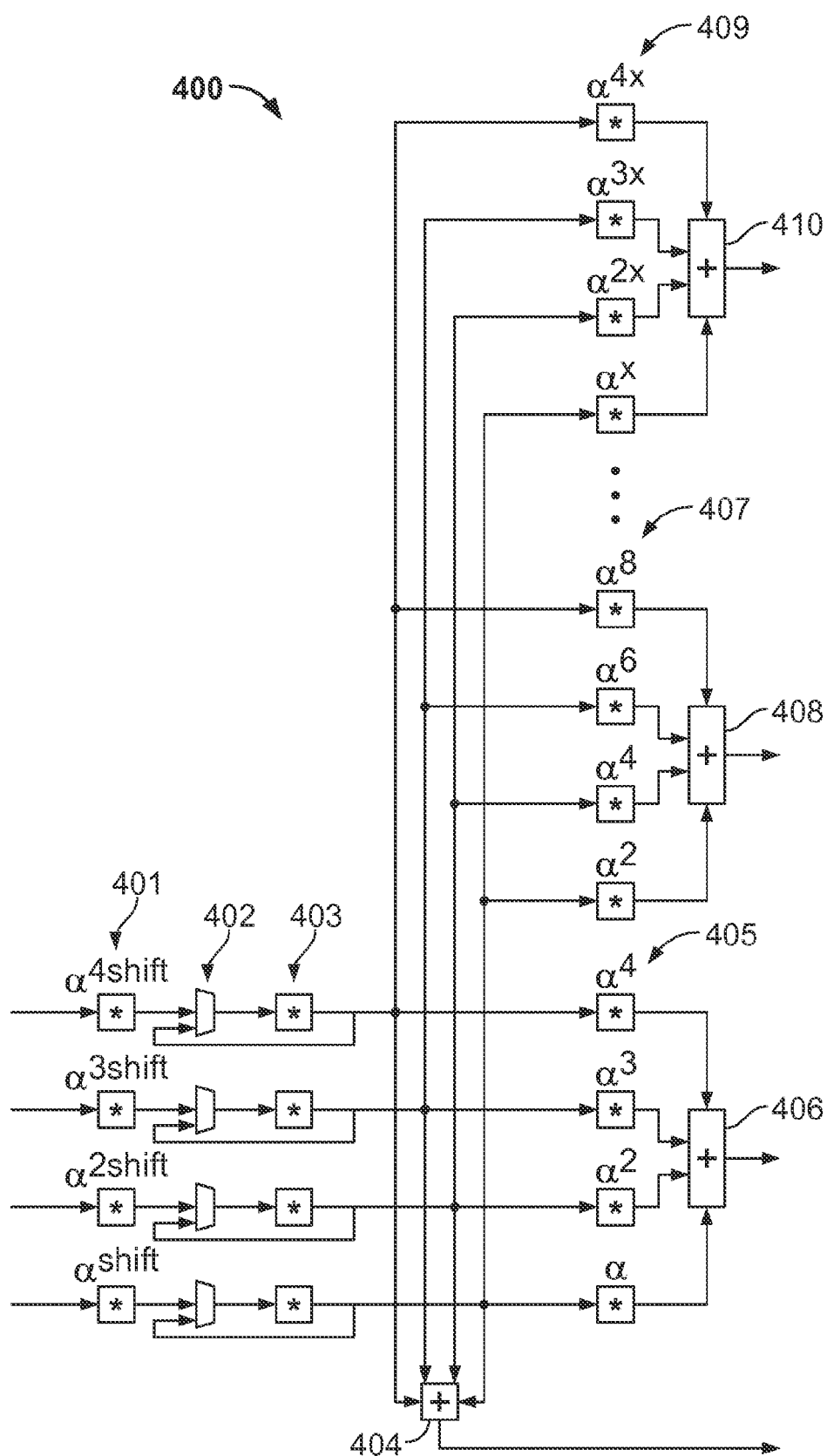
FIG. 4 illustrates an architecture for performing a Chien search and computing error values in accordance with an arrangement.

FIG. 4 illustrates an architecture for performing a Chien search and computing error values in accordance with an arrangement. In an arrangement, architecture 400 is included in the Chien search and error calculation module 150. For illustration purposes, FIG. 4 illustrates the case where the number of check symbols, n−k, is 8. Accordingly, there are 8 syndrome values $S_1, \ldots, S_8$. As depicted in FIG. 4, the architecture 400 employs a parallel structure of degree x+1, where x is the index of the root powers of the Galois field multiplier 409.

The error locator polynomial terms computed by the error locator polynomial module 140 are input to the architecture 400 and shifted to the first shift location by the multipliers in multiplier bank 401. The first search location is shifted by a power of the primitive root. This value is the difference between the field size and the number of symbols in the codeword. For example, the NRZ FEC standard specified by IEEE802.3, has n=528 total symbols, k=514 data symbols, m=10 bits per symbol. Thus, the field size is $2^m=1024$ and the shift value is 1024−528=496. Further, because multiples of this root index are larger than the field size, the higher order root indexes are calculated modulo field size.

Alternatively, in an arrangement, the shifts performed by the multipliers of the multiplier bank 401 may be performed instead by multipliers of the multiplier bank 220 of the architecture 200 by multiplying each of the error locator polynomial coefficients by an appropriate shift value before sending the coefficients to the architecture 400.

Consider the case where the parallelism is 1 (i.e., x=0). In this case, the shifted error locator polynomials output by the multiplier bank 401 are input to the multipliers of multiplier bank 403. In particular, each multiplier of the multiplier bank 403 is a constant multiplier with increasing root powers ($\alpha^1$, $\alpha^2$, $\alpha^3$, $\alpha^4$, and so on) in the coefficient index produced by enabling the corresponding multiplier from multiplier bank 402. The multipliers are then iterated for the number of locations to test, which is a total of n symbols. The outputs of the multiplier bank 403 are all summed by adder 404 to check for a root of the error locator polynomial, i.e., to determine whether there is an error at the specified symbol location.

Alternatively, in an arrangement, the shifts performed by the multipliers of the multiplier banks 510 and 511 may be performed instead by the multipliers of the multiplier banks 307 and 308 of the architecture 300 by multiplying each of the error locator polynomial coefficients by an appropriate shift value before the coefficients are sent to the architecture 400.

Consider the case where the parallelism is x>0. In this case, the root powers for the coefficients of multipliers in the multiplier bank 403 are multiplied by the quantity x+1, which results in outputs $\alpha^{(x+1)}$, $\alpha^{2(x+1)}$, $\alpha^{3(x+1)}$, $\alpha^{4(x+1)}$, and so on. This means that the locations searched by multipliers in the multiplier bank 403 would increment by x+1 positions. The intermediate values can then be searched without using the error locator polynomial, but instead by shifting the multiplier outputs of the multiplier bank 403 by one or more (up to x) positions. This can be performed using multipliers 405, 407, and 409. Similarly, adders 406, 408, and 410 can then sum the shifted values to check for roots of the error locator polynomial.

Figure 5:
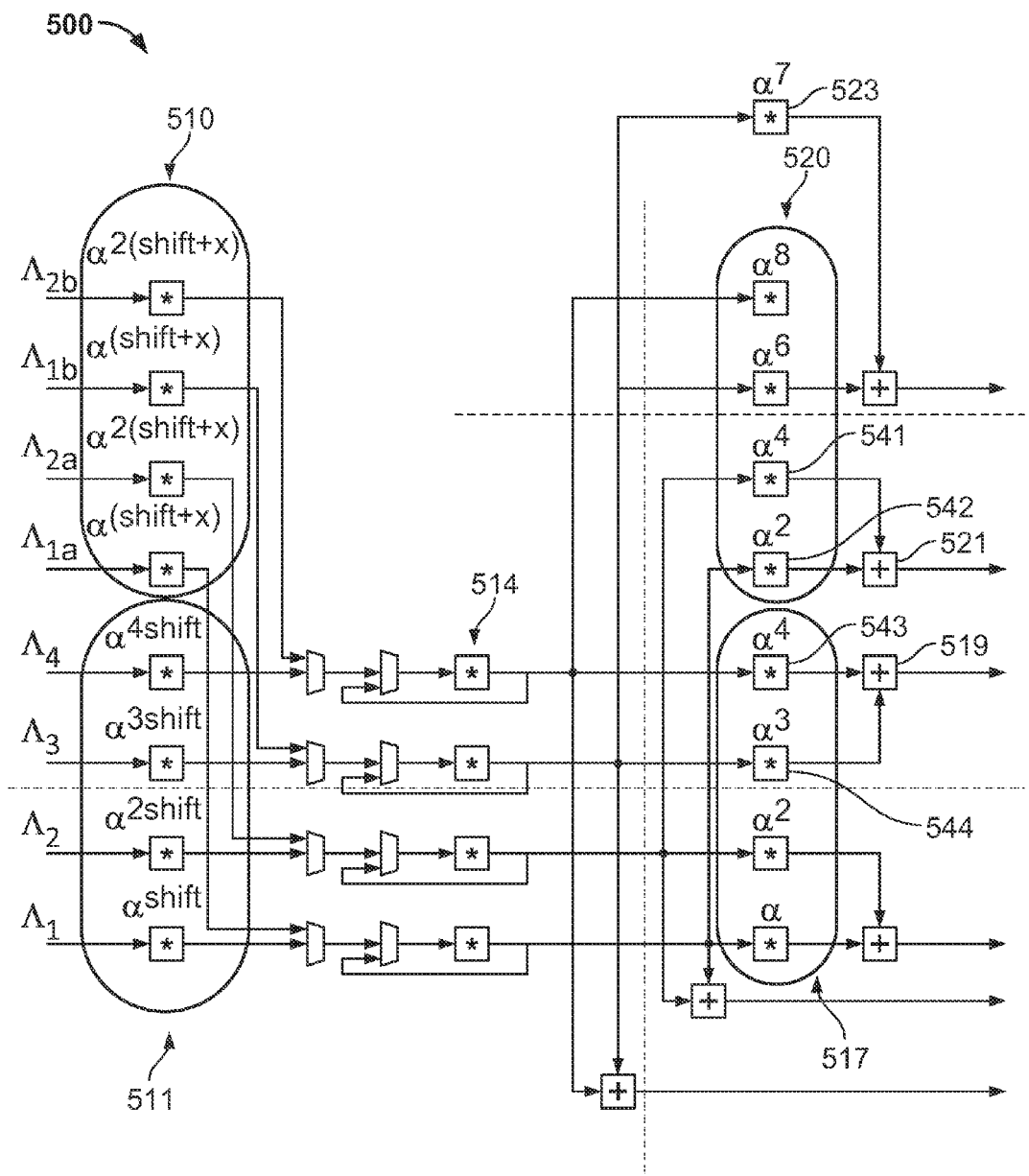
FIG. 5 illustrates an architecture, based on an umbrella decomposition of a Reed-Solomon code, for performing a Chien search and computing error values in accordance with an arrangement.

FIG. 5 illustrates an architecture, based on an umbrella decomposition of a Reed-Solomon code, for performing a Chien search and computing error values in accordance with an arrangement. Specifically, FIG. 5 depicts an architecture similar to that of the architecture 400 but decomposed into two parallel substructures. Specifically, the architecture 500 depicts an umbrella decomposition of a mother (n, k) Reed-Solomon code into two (n/2, k/2) daughter Reed-Solomon codes. As would be understood by one of ordinary skill in the art, based on the disclosure and teachings herein, while the architecture 500 illustrates a decomposition factor of two, the same principles and techniques can be used to design an architecture equal to any valid decomposition factor between a mother code and a corresponding daughter code.

As compared to the architecture 400, the architecture 500 requires an additional input shift multiplier bank 510 and multiplier bank 523 (only one multiplier is depicted from the bank for clarity). The multipliers of the multiplier bank 511 are used to shift the mother code error locator polynomial to the first search location and the multipliers of the multiplier bank 510 are used to shift the two daughter code polynomials to their first search locations. Accordingly, the shift values for the four multipliers in the multiplier bank 511 are different, while the shift values for the four multipliers in the multiplier bank 510 represent two sets of the same shift values.

For the two daughter code searches, the four multipliers of the multiplier bank 514 are split into two groups of two multipliers, where each group searches for a respective daughter code error locator polynomial. Similarly, the four multipliers of the multiplier bank 520 and the four multipliers of the multiplier bank 517 are split into two groups of two multipliers each. In particular, each group of multipliers within each of the multiplier banks 517 and 520 shifts its respective daughter code base search value into the same number of parallel locations as the mother code.

The architecture 500 does not add the outputs of all multipliers in a group as is the case in the architecture 400 (see, e.g., the outputs of adders 406, 408, and 410). Instead, in the architecture 500, only a subset of multiplier outputs is added for each shifted search location, and for each daughter code. For example, the adder 521 adds the outputs only of the multipliers 541 and 542, and the adder 519 adds the outputs only of the multipliers 543 and 544. Further, adders identical to those of the adders 406 and 408 of the architecture 400 also exist in the architecture 500, but are omitted from FIG. 5 for visual clarity.

It is noted that the simple case of splitting at t=2 mother code into two t=1 daughter codes illustrated by the architecture 500 is merely illustrative. In practice, a mother code with a much larger polynomial length is used and the savings are larger. This is because a larger polynomial length makes it more likely that a shift multiply value for a particular polynomial term will exist in the matrix of all polynomial terms multiplied by all shift values, and thus, that savings may be obtained.

Figure 6:
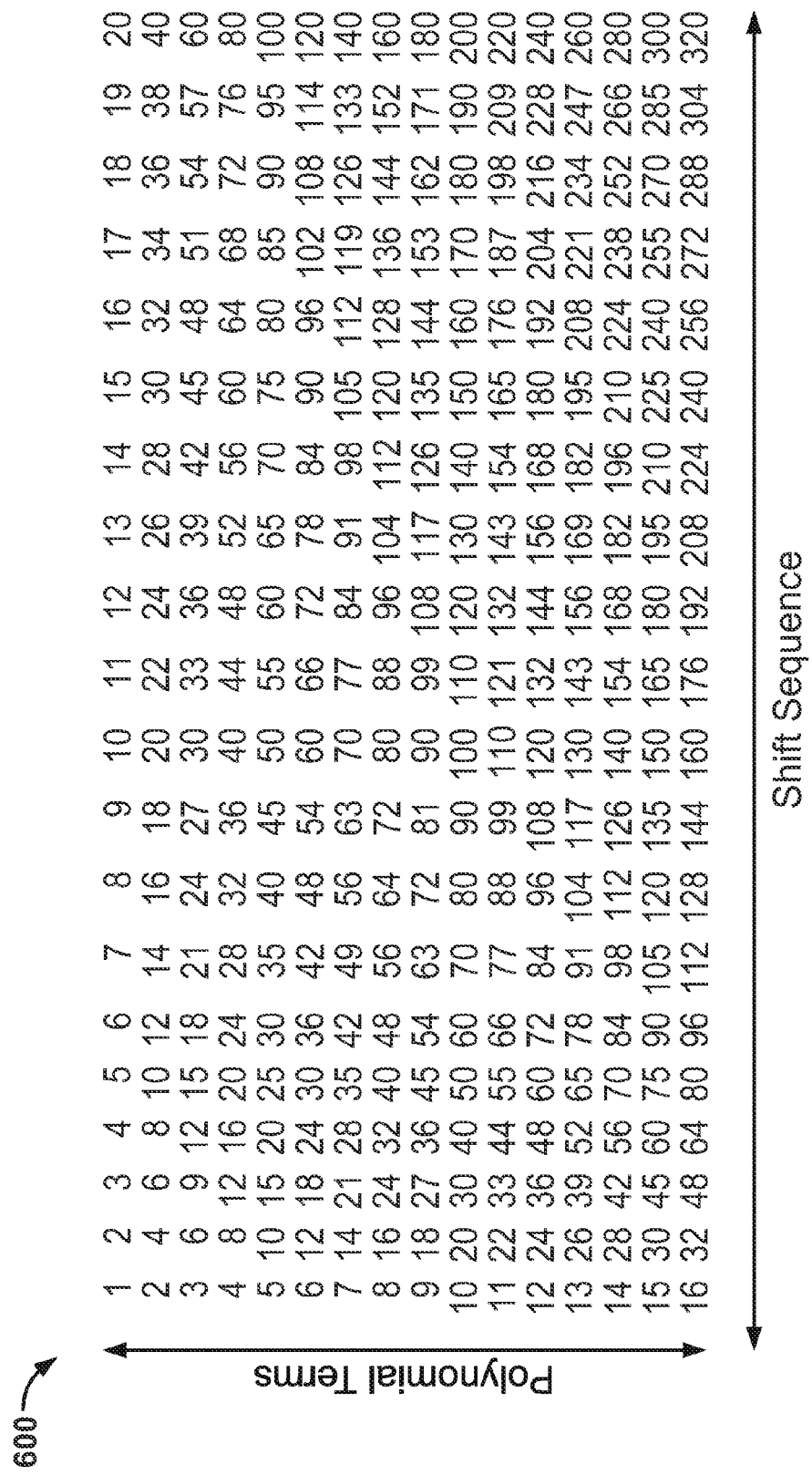
FIG. 6 illustrates shift coefficients corresponding to a Reed-Solomon mother code having an error locator polynomial 16 coefficients in length (i.e., capable of correcting up to 16 symbol errors), and having a parallelism of 21, in accordance with an arrangement.

FIG. 6 illustrates powers of shift values (i.e., respective values of x in the shift value $\alpha^x$) corresponding to a Reed-Solomon mother code having an error locator polynomial 16 coefficients in length (i.e., capable of correcting up to 16 symbol errors), and having a parallelism of 21, in accordance with an arrangement. In table 600, each column corresponds to powers of shift values applied to shift a base state of a search location to a different location. The 20 columns of the table 600 correspond to 20 additional search locations (in addition to the base location) searched per clock cycle. The values of the table 600 are values that would be input to a multiplier bank corresponding to the multiplier banks 517 and 520 of FIG. 5 (or, depending on the parameters of the Reed-Solomon code, a suitably modified version of those multiplier banks). In particular, an implementation of the Reed-Solomon mother code depicted by the table 600 in the architecture 500 would require 320 multipliers, as there are 320 entries in the table 600.

Figure 7:
FIG. 7 illustrates shift coefficients for two Reed-Solomon daughter codes corresponding to the Reed-Solomon mother code of FIG. 6 in accordance with an arrangement.

FIG. 7 illustrates powers of shift values for two Reed-Solomon daughter codes corresponding to the Reed-Solomon mother code of FIG. 6 in accordance with an arrangement. In particular, the table 725 illustrates the powers of shift values applied to shift a base state of a search location to a different location for each of eight multipliers associated with the first daughter code and table 775 illustrates the powers of shift values applied to shift a base state of the search location to a different location for each of eight multipliers associated with the second daughter code.

A number of multipliers required to implement the two daughter codes of the table 700 is less than the 320 multipliers needed to implement the mother code corresponding to the table 600. Specifically, in an arrangement, the first daughter code is implemented using a "full set" of 160 multipliers, corresponding to the 160 entries of the table 725. However, given this implementation, less than 160 multipliers are needed to implement the second daughter code. This is because there are shifted versions of certain polynomial terms calculated in the implementation of the second daughter code and the mother code available from the implementation of the first daughter code. The reuse of multiplier outputs from the implementation of the first daughter code and the mother code by the implementation of the second daughter code is illustrated in FIG. 6. In particular, the underlined values in the table 775 denote multiplies (i.e., calculated multiplication values) that already exist in circuitry for a given polynomial term in the implementation of the first daughter code. As there are 27 underlined terms in the table 775, there exist 27 multipliers that can be re-used. As a result, the implementation of the two daughter codes corresponding to the table 700 requires a total of only 293 multipliers (instead of a total of 320 multipliers).

Figure 8:
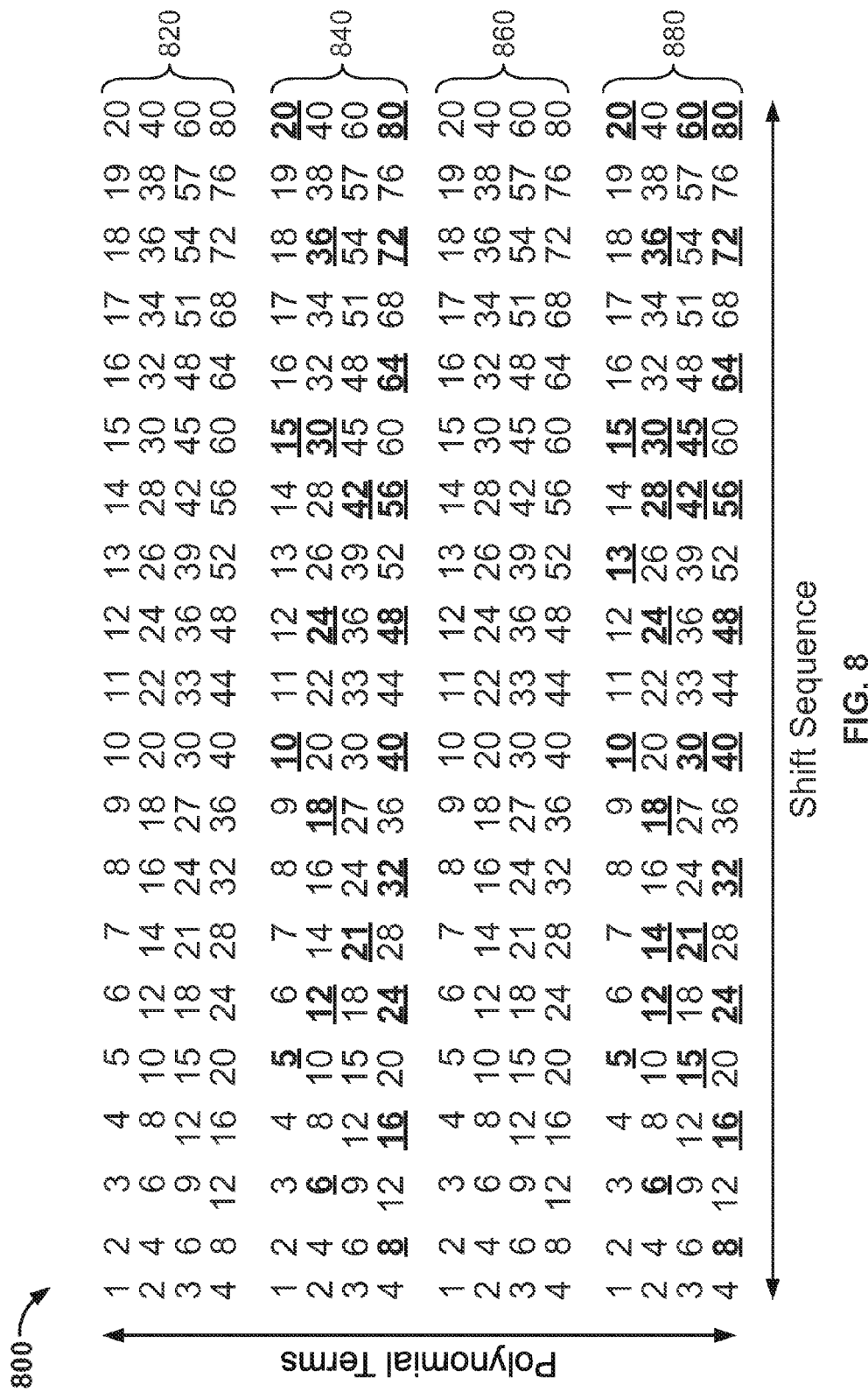
FIG. 8 illustrates shift coefficients for four Reed-Solomon daughter codes corresponding to the Reed-Solomon mother code of FIG. 6 in accordance with an arrangement.

FIG. 8 illustrates powers of shift values for four Reed-Solomon daughter codes corresponding to the Reed-Solomon mother code of FIG. 6 in accordance with an arrangement. Specifically, table 820 illustrates powers of shift values applied to shift a base state of a search location to a different location for each of four multipliers associated with the first daughter code. Similarly, tables 840, 860, and 880 illustrate the powers of shift values applied to shift a base state of a search location to a different location for each of four multipliers associated with the second daughter code, third daughter code, and fourth daughter code, respectively.

As depicted by underlined entries in the tables 840 and 880, the implementation of the second and fourth daughter codes may reuse multipliers from both the mother code (FIG. 6) and the first daughter code decomposition (FIG. 7). Duplicated multiplies are shown in underline in FIG. 8. As depicted in tables 820 and 840, 51 multiplies are reused, so that a total of only 109 multipliers (instead of 160 multipliers) are needed to implement the first and second daughter codes. Further, as depicted in tables 860 and 880, the third daughter code has 69 multiplies that are reused, so that a total of only 91 multipliers (instead of 160 multipliers) are needed to implement the third and fourth daughter codes. In a similar fashion, the implementation of a Reed-Solomon mother code may be decomposed into eight Reed-Solomon daughter codes to achieve a higher degree of reuse of multiplies. Further, in the case where 16 Reed-Solomon daughter codes are used, one-half of all multiplies may be reused, so that a total of only 160 multipliers are needed. It is noted that, in general, not all daughter code decompositions of a mother code are required in a decoder implementation. In particular, a given implementation may support only a subset of possible Reed-Solomon daughter code decompositions of a Reed-Solomon mother code.

For example, where a t; =16 code is decomposed into two t=8, four t=4, eight t=2, and sixteen t=1 daughter codes, 640 additional multipliers would be required to implement all of hardware structures and, in an arrangement, this would almost triple the area of the Chien search circuitry (which already is the largest component of a highly parallel decoder). In contrast, by using an optimized coefficient matrix, as described above, for each of these decomposed structures, a total of only 133+109+91+80=413 additional multipliers are required.

Figure 9:
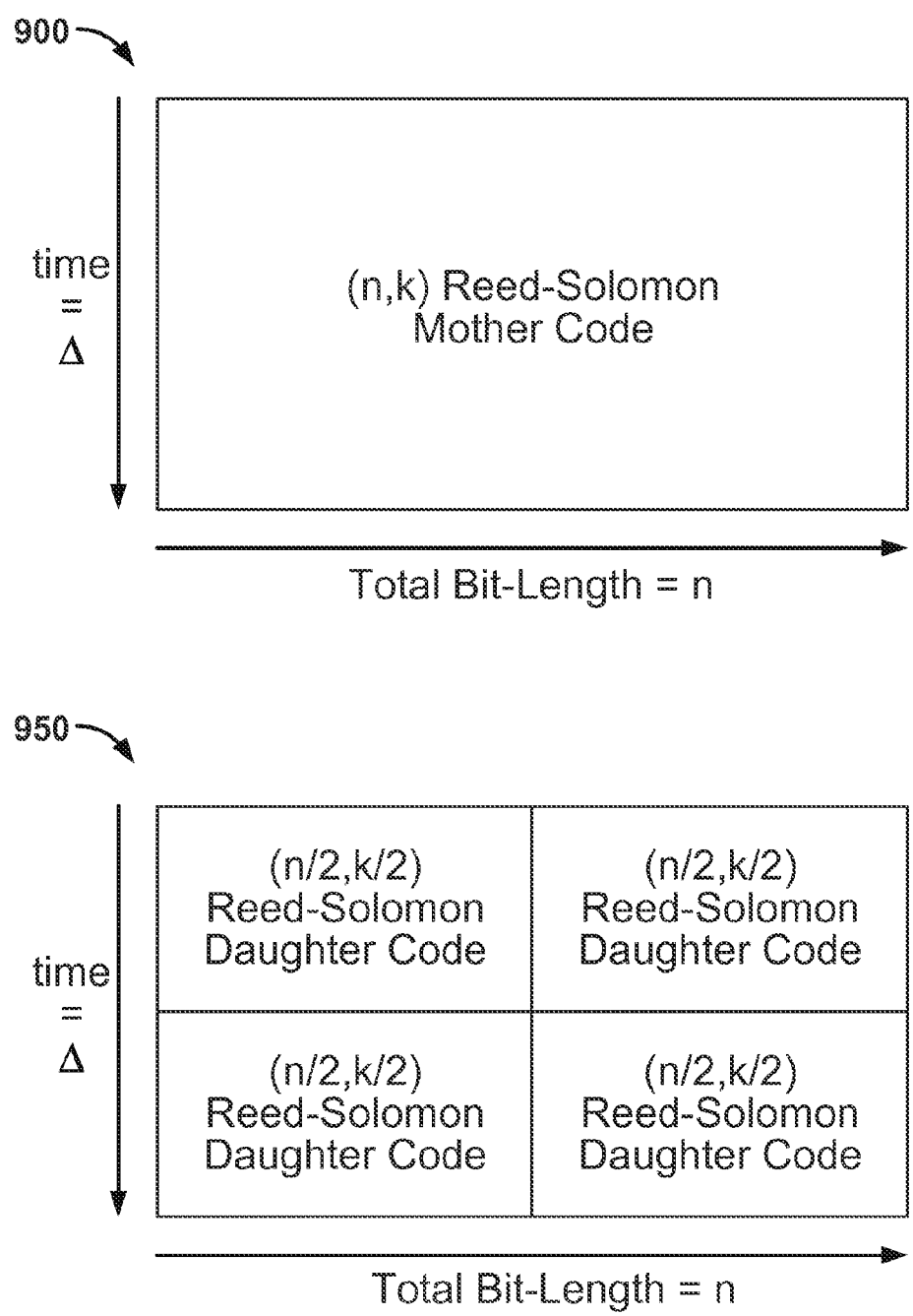
FIG. 9 compares and contrasts a data flow for processing a Reed-Solomon mother code and a corresponding set of Reed-Solomon daughter codes in accordance with an arrangement.

FIG. 9 compares and contrasts a data flow for processing a Reed-Solomon mother code and a corresponding set of Reed-Solomon daughter codes in accordance with an arrangement. As depicted in FIG. 9, two (n/2, k/2) Reed-Solomon daughter codes may be processed in approximately the same amount of time, a time of $\Delta$, as a (n, k) Reed-Solomon mother code. Further, the number of computations required for a syndrome calculation is proportional to $n^2$−nk so that the computational complexity required for determining syndromes for the two (n/2, k/2) Reed-Solomon daughter codes is approximately the same as the computational complexity required for determining a syndrome for the one (n, k) Reed-Solomon mother code.

Further, the computational complexity required for the calculation of error locator polynomials is proportional to $(n-k)^2$, so that the computational complexity required for determining polynomials for both of the (n/2, k/2) Reed-Solomon daughter codes is approximately the same as the computational complexity required for determining a polynomial for the one (n, k) Reed-Solomon mother code. As with the syndrome calculation, the computational complexity of a Chien search is also proportional to $(n^2-nk)$, but the generally large size of this logic means that reuse of logic is required, as explained above with respect to FIGS. 6-8.

It will be understood that the foregoing is only illustrative of the principles of the invention, and that various modifications may be made by those skilled in the art without departing from the scope and spirit of the invention, and the present invention is limited only by the claims that follow.

What is claimed is:

1. Codeword processing circuitry comprising:
    receiver circuitry configured to receive a Reed-Solomon mother codeword n symbols in length and having k check symbols;
    parallelization circuitry configured to separate the n symbols of the received Reed-Solomon mother codeword into v Reed-Solomon daughter codewords, wherein v is a decomposition factor associated with the received Reed-Solomon mother codeword; and
    decoding circuitry configured to process the v Reed-Solomon daughter codewords in a respective set of v parallel processes to output v decoded codewords.

2. The codeword processing circuitry of claim 1, further comprising identification circuitry configured to determine the decomposition factor v based, at least in part, on a channel quality over which the Reed-Solomon mother codeword is transmitted.

3. The codeword processing circuitry of claim 1, wherein the decoding circuitry comprises a syndrome computation module configured to process symbols corresponding to each of the v Reed-Solomon daughter codewords to produce syndrome values corresponding to the received Reed-Solomon mother codeword.

4. The codeword processing circuitry of claim 1, wherein the decoding circuitry comprises an error locator polynomial module configured to:
    receive syndrome values corresponding to each of the v Reed-Solomon daughter codewords; and
    process the received syndrome values in v parallel processes, each parallel process corresponding to a respective one of the v Reed-Solomon daughter codewords, to produce v error locator polynomials.

5. The codeword processing circuitry of claim 1, wherein the decoding circuitry comprises an error locator polynomial module configured to:
    receive syndrome values corresponding to each of the v Reed-Solomon daughter codewords; and
    process the received syndrome values in v sequential processes, each sequential process corresponding to a respective one of the v Reed-Solomon daughter codewords, to produce v error locator polynomials.

6. The codeword processing circuitry of claim 1, wherein the decoding circuitry comprises:
    a Chien search and error calculation module configured to receive error locator polynomial coefficients corresponding to each of the v Reed-Solomon daughter codewords; and
    process the received error locator polynomial coefficients in v parallel processes, each parallel process corresponding to a respective one of the v Reed-Solomon daughter codewords, to produce v output codewords.

7. The codeword processing circuitry of claim 1, wherein each of the v Reed-Solomon daughter codewords is a (n/v, k/v) Reed-Solomon codeword.

8. The codeword processing circuitry of claim 1, wherein the decomposition factor v is based, at least in part, on a network data throughput requirement.

9. A method comprising:
    receiving a Reed-Solomon mother codeword n symbols in length and having k check symbols;
    separating the n symbols of the received Reed-Solomon mother codeword into v Reed-Solomon daughter codewords, wherein v is a decomposition factor associated with the received Reed-Solomon mother codeword; and
    processing the v Reed-Solomon daughter codewords in a respective set of v parallel processes to output v decoded codewords.

10. The method of claim 9, wherein a determination of the decomposition factor v is based, at least in part, on a channel quality over which the Reed-Solomon mother codeword is transmitted.

11. The method of claim 9, further comprising processing symbols corresponding to each of the v Reed-Solomon daughter codewords to produce syndrome values corresponding to the received Reed-Solomon mother codeword.

12. The method of claim 9, further comprising:
    receiving syndrome values corresponding to each of the v Reed-Solomon daughter codewords; and
    processing the received syndrome values in v parallel processes, each parallel process corresponding to a respective one of the v Reed-Solomon daughter codewords, to produce v error locator polynomials.

13. The method of claim 9, further comprising:
    receiving syndrome values corresponding to each of the v Reed-Solomon daughter codewords; and
    processing the received syndrome values in v sequential processes, each sequential process corresponding to a respective one of the v Reed-Solomon daughter codewords, to produce v error locator polynomials.

14. The method of claim 9, further comprising:
    receiving error locator polynomial coefficients corresponding to each of the v Reed-Solomon daughter codewords; and
    processing the received error locator polynomial coefficients in v parallel processes, each parallel process corresponding to a respective one of the v Reed-Solomon daughter codewords, to produce v output codewords.

15. The method of claim 9, wherein each of the v Reed-Solomon daughter codewords is a (n/v, k/v) Reed-Solomon codeword.

* * * * *